(12) United States Patent
Satpathy et al.

(10) Patent No.: US 8,868,817 B2
(45) Date of Patent: Oct. 21, 2014

(54) CROSSBAR CIRCUITRY FOR APPLYING AN ADAPTIVE PRIORITY SCHEME AND METHOD OF OPERATION OF SUCH CROSSBAR CIRCUITRY

(75) Inventors: Sudhir Kumar Satpathy, Ann Arbor, MI (US); David Theodore Blaauw, Ann Arbor, MI (US); Dennis Michael Sylvester, Ann Arbor, MI (US); Trevor Nigel Mudge, Ann Arbor, MI (US)

(73) Assignee: The Regents of the University of Michigan, Ann Arbor, MI (US)

(*) Notice: Subject to any disclaimer, the term of this patent is extended or adjusted under 35 U.S.C. 154(b) by 232 days.

(21) Appl. No.: 13/438,920

(22) Filed: Apr. 4, 2012

(65) Prior Publication Data

US 2012/0254491 A1 Oct. 4, 2012

Related U.S. Application Data

(63) Continuation-in-part of application No. 12/926,462, filed on Nov. 18, 2010, now Pat. No. 8,549,207, which is a continuation-in-part of application No. 12/458,511, filed on Jul. 14, 2009, now Pat. No. 8,230,152, which is a continuation-in-part of application No. 12/379,191, filed on Feb. 13, 2009, now Pat. No. 8,108,585.

(51) Int. Cl.
  *G06F 13/00* (2006.01)
  *G11C 7/10* (2006.01)
  *G06F 13/40* (2006.01)
  *H03K 17/693* (2006.01)

(52) U.S. Cl.
  CPC ............. *G11C 7/10* (2013.01); *G06F 13/4022* (2013.01); *G06F 2213/0038* (2013.01); *G11C 7/1012* (2013.01); *H03K 17/693* (2013.01)

USPC .......................................................... 710/317

(58) Field of Classification Search
  USPC ................................................. 710/305–317
  See application file for complete search history.

(56) References Cited

U.S. PATENT DOCUMENTS

| 5,053,942 A | 10/1991 | Srini |
| 5,896,516 A | 4/1999 | Powell et al. |

(Continued)

FOREIGN PATENT DOCUMENTS

| EP | 1 089 461 | 4/2001 |
| EP | 1 115 230 | 7/2001 |

(Continued)

OTHER PUBLICATIONS

Golshan et al., "A novel reduced swing CMOS BUS interface circuit for high speed low power VLSI systems", *IEEE Explore*, Jan. 22, 2009, pp. 351-354.

(Continued)

*Primary Examiner* — Raymond Phan
(74) *Attorney, Agent, or Firm* — Nixon & Vanderhye P.C.

(57) ABSTRACT

Interconnect circuitry 2 has a plurality of data source circuits 8 connected to respective input paths 4 and a plurality of data destination circuits 10 connected to respective output paths 6. Connection cells 12 provide selective connections between input paths 4 and output paths 6. Arbitration circuitry 26 provides adaptive priority arbitration between overlapping requests received at different input paths. Priority bits 16 within a matrix of priority bit 46 for each output path 10 are used to represent the priority relationships between different input paths which compete for access to that output path 10. Update operations are applied on a per row or per column basis within the matrix to implement update schemes such as least recently granted, most recently granted, round robin, reversal, swap, selective least recently granted, selective most recently granted etc.

22 Claims, 7 Drawing Sheets

(56) References Cited

U.S. PATENT DOCUMENTS

| | | | |
|---|---|---|---|
| 5,991,296 | A | 11/1999 | Mu et al. |
| 6,356,111 | B1 | 3/2002 | Moss |
| 6,715,023 | B1 | 3/2004 | Abu-Lebdeh et al. |
| 6,771,162 | B1 | 8/2004 | Moss |
| 7,161,906 | B2 | 1/2007 | Dell et al. |
| 7,178,005 | B1 | 2/2007 | Jordan et al. |
| 7,424,013 | B1 | 9/2008 | Yun et al. |
| 7,907,625 | B1 | 3/2011 | MacAdam |
| 8,108,585 | B2 * | 1/2012 | Satpathy et al. ............ 710/317 |
| 8,155,134 | B2 | 4/2012 | Fairhurst et al. |
| 8,230,152 | B2 * | 7/2012 | Satpathy et al. ............ 710/317 |
| 8,255,610 | B2 | 8/2012 | Satpathy et al. |
| 8,549,207 | B2 * | 10/2013 | Satpathy et al. ............ 710/317 |
| 2003/0221043 | A1 | 11/2003 | Sota |
| 2004/0062238 | A1 | 4/2004 | Yoshizawa et al. |
| 2005/0097256 | A1 | 5/2005 | Jones |
| 2006/0031625 | A1 | 2/2006 | Chan |
| 2008/0186961 | A1 | 8/2008 | Yun et al. |
| 2009/0034517 | A1 | 2/2009 | Yang et al. |
| 2009/0089478 | A1 | 4/2009 | Singh et al. |
| 2011/0181307 | A1 | 7/2011 | Kuekes |
| 2012/0254491 | A1 | 10/2012 | Satpathy et al. |

FOREIGN PATENT DOCUMENTS

| | | |
|---|---|---|
| JP | 2001-197068 | 7/2001 |
| WO | WO 99/35879 | 7/1999 |
| WO | WO 2004/049645 | 6/2004 |

OTHER PUBLICATIONS

Chang et al., "A 50 Gb/s 32 × 32 CMOS Crossbar Chip using Asymmetric Serial Links", *Computer System Laboratory, Stanford University*, Apr. 1999, (4 pages).

Wu et al., "A 2Gb/s 256 * 256 CMOS Crossbar Switch Fabric Core Design using Pipelined MUX", *IEEE*, Jul. 2002, pp. II-568-II-571.

Wijetunga, "High-performance crossbar design for system-on-chip", *3rd IEEE International Workshop*, Jun. 2003, (6 pages).

Borgatti et al., "A Multi-Context 6.4Gb/s/Channel On-Chip Communication Network Using 0.18μm Flash-EEPROM Switches and Elastic Interconnects", *IEEE International Solid-State Circuits Conference*, Sep. 2003, (3 pages).

Chi et al., "Decomposed Arbiters for Large Crossbars with Multi-Queue Input Buffers", *IEEE International Conference on Computer Design*, Oct. 14-16, 1991, pp. 233-238.

Delgado-Frias et al., "A VLSI Crossbar Switch with Wrapped Wave Front Arbitration", IEEE Transactions on Circuits and Systems, vol. 50, Issue 1, Jan. 2003, pp. 135-142.

Kavaldjiev et al., "A Virtual Channel Router for On-chip Networks", IEEE International SoC Conference, Sep. 12-15, 2004, pp. 289-293.

Shin et al, "Round-robin Arbiter Design and Generation", International Symposium on System Synthesis, 2002, pp. 243-248.

Molnar et al., "Simple Circuits that Work for Complicated Reasons", International Symposium on Advanced Research in Asynchronous Circuits and Systems, 2000, 12 pages.

Josephs et al., "CMOS Design of the Tree Arbiter Element", IEEE Transactions on VLSI systems, vol. 4, Issue 4, Dec. 1996, pp. 472-476.

Plummer, "Asynchronous Arbiters", IEEE Transactions on Computers Archive, vol. 21, Issue 1, Jan. 1972), pp. 37-42.

UK Search Report dated Apr. 16, 2010 for GB 1000172.5.

Notice of Allowance mailed Jun. 13, 2013 in co-pending U.S. Appl. No. 12/926,462.

D. Seo et al, "Table-lookup based Crossbar Arbitration for Minimal-Routed, 2D Mesh and Torus Networks" Parallel and Distributed Processing Symposium, 2007, IPDPS 2007, IEEE International, Mar. 2007, pp. 1, 10, 26-30.

C. Minkenberg et al, "Reliable control protocol for crossbar arbitration" Communications Letters, IEEE, vol. 9, No. 2, Feb. 2005, pp. 178, 180.

C. Minkenberg et al, "Low-latency pipelined crossbar arbitration" Global Telecommunications Conference, 2004, GLOBECOM'04, IEEE, vol. 2, Nov. 2004, pp. 1174, 1179.

C. Nitta et al, "DCAF—A Directly Connected Arbitration-Free Photonic Crossbar for Energy-Efficient High Performance Computing" Parallel & Distributed Processing Symposium (IPDPS), 2012 IEEE 26th International, May 2012, pp. 1144, 1155.

L. Zhang, "VirtualClock: A New Traffic Control Algorithm for Packet Switching Networks" *SIGCOMM Proceedings of the ACM Symposium on Communications Architectures & Protocols*, 1990, pp. 19-29.

S. Satpathy et al, "A 4.5Tb/s 3.4 Tb/s/W 64×64 Switch Fabric With Self-Updating Least-Recently-Granted Priority and Quality-of-Service Arbitration in 45 nm CMOS" *International Solid State Circuits Conference*, 2012, 2 pages.

B. Grot et al, "Preemptive Virtual Clock: A Flexible, Efficient, and Cost-effective Qos Scheme for Networks-on-Chip" *MICRO '09 Proceedings 42nd Annual IEEE/ACM Int. Symp. Microarchit.*, 2009, 12 pages.

K.H. Yum et al, "Investigating QoS Support for Traffic Mixes with the MediaWorm Router" *High-Performance Computer Architecture*, 2000, 10 pages.

A.A. Chien et al, "Approaches to Quality of Service in High-Performance Networks" *Proceedings of the Parallel Computer Routing and Communications Workshop*, Jul. 1997, 17 pages.

J.W. Lee et al, "Globally-Synchronized Frames for Guaranteed Quality-of-Service in On-Chip Networks" *35th IEEE/ACM International Symposium on Computer Architecture (ISCA)*, Jun. 2008, 12 pages.

Office Action mailed Feb. 22, 2013 in co-pending U.S. Appl. No. 12/926,462.

* cited by examiner

Swap

|   | Swap |   |   |   |   |   |
|---|---|---|---|---|---|---|
| X | 0 | 0 | 1 | 0 | 0 | 1 |
| 1 | X | 1 | 1 | 0 | 0 | 3 |
| 1 | 0 | X | 1 | 0 | 0 | 2 |
| 0 | 0 | 0 | X | 0 | 0 | 0 |
| 1 | 1 | 1 | 1 | X | 1 | 5 |
| 1 | 1 | 1 | 1 | 0 | X | 4 |

Old Priority

→

| X | 0 | 1 | 0 | 0 | 0 | 1 |
|---|---|---|---|---|---|---|
| 1 | X | 1 | 1 | 0 | 0 | 3 |
| 0 | 0 | X | 0 | 0 | 0 | 0 |
| 1 | 0 | 1 | X | 0 | 0 | 2 |
| 1 | 1 | 1 | 1 | X | 1 | 5 |
| 1 | 1 | 1 | 1 | 0 | X | 4 | new Priority

FIG. 9

Reversal

|   |   | Flip |   |   |   |   |
|---|---|---|---|---|---|---|
| X | 0 | 0 | 1 | 0 | 0 | 1 |
| 1 | X | 1 | 1 | 0 | 0 | 3 |
| 1 | 0 | X | 1 | 0 | 0 | 2 |
| 0 | 0 | 0 | X | 0 | 0 | 0 |
| 1 | 1 | 1 | 1 | X | 1 | 5 |
| 1 | 1 | 1 | 1 | 0 | X | 4 |

Old Priority

→

| X | 1 | 1 | 0 | 1 | 1 | 4 |
|---|---|---|---|---|---|---|
| 0 | X | 0 | 0 | 1 | 1 | 2 |
| 0 | 1 | X | 0 | 1 | 1 | 3 |
| 1 | 1 | 1 | X | 1 | 1 | 5 |
| 0 | 0 | 0 | 0 | X | 0 | 0 |
| 0 | 0 | 0 | 0 | 1 | X | 1 | new Priority

FIG. 10

Selective Least Recently Granted

|   |   |   |   | x |   | S |   |
|---|---|---|---|---|---|---|---|
| √ | X | 0 | 0 | 1 | 0 | 0 | 1 |
| √ | 1 | X | 1 | 1 | 0 | 0 | 3 |
| √ | 1 | 0 | X | 1 | 0 | 0 | 2 |
| x | 0 | 0 | 0 | X | 0 | 0 | 0 |
| √ | 1 | 1 | 1 | 1 | X | 1 | 5 |
| R | 1 | 1 | 1 | 1 | 0 | X | 4 |

Freeze this row   Freeze this column   Old Priority

→

| X | 0 | 0 | 1 | 0 | 1 | 2 |
|---|---|---|---|---|---|---|
| 1 | X | 1 | 1 | 0 | 1 | 4 |
| 1 | 0 | X | 1 | 0 | 1 | 3 |
| 0 | 0 | 0 | X | 0 | 0 | 0 |
| 1 | 1 | 1 | 1 | X | 1 | 5 |
| 0 | 0 | 0 | 0 | 0 | X | 1 | new Priority

FIG. 11

Selective Most Recently Granted

| | R | | | X | | | |
|---|---|---|---|---|---|---|---|
| S | X | 0 | 0 | 1 | 0 | 0 | 1 |
| √ | 1 | X | 1 | 0 | 0 | 3 |
| √ | 1 | 0 | X | 1 | 0 | 0 | 2 |
| √ | 0 | 0 | 0 | X | 0 | 0 | 0 |
| X | 1 | 1 | 1 | X | 1 | 5 |
| √ | 1 | 1 | 1 | 0 | X | 4 |

Freeze this row · Freeze this column · Old Priority

→

| X | 1 | 1 | 1 | 0 | 1 | 4 |
|---|---|---|---|---|---|---|
| 0 | X | 1 | 1 | 0 | 0 | 2 |
| 0 | 0 | X | 1 | 0 | 0 | 1 |
| 0 | 0 | 0 | X | 0 | 0 | 0 |
| 1 | 1 | 1 | 1 | X | 1 | 5 |
| 0 | 1 | 1 | 1 | 0 | X | 3 | new Priority

CROSSBAR CIRCUITRY FOR APPLYING AN ADAPTIVE PRIORITY SCHEME AND METHOD OF OPERATION OF SUCH CROSSBAR CIRCUITRY

This application is a continuation-in-part of U.S. patent application Ser. No. 12/926,462 filed 18 Nov. 2010 now U.S. Pat. No. 8,549,207 entitled "CROSSBAR CIRCUITRY FOR APPLYING AN ADAPTIVE PRIORITY SCHEME AND METHOD OF OPERATION OF SUCH CROSSBAR CIRCUITRY", which is a continuation-in-part of U.S. patent application Ser. No. 12/458,511 filed 14 Jul. 2009 now U.S. Pat. No. 8,230,152, which is a continuation-in-part of U.S. patent application Ser. No. 12/379,191 filed 13 Feb. 2009 now U.S. Pat. No. 8,108,585, the contents of each of which are incorporated herein in their entirety by reference.

BACKGROUND OF THE INVENTION

1. Field of the Invention

This invention relates to interconnect circuitry for connecting a plurality of data sources to a plurality of data destinations. More particularly, this invention relates to the management of arbitration between a plurality of data sources seeking to access a data output.

2. Description of the Prior Art

It is known to provide interconnect circuitry, such as a crossbar circuit, that is a switch infrastructure for connecting multiple inputs to multiple outputs in a matrix manner. Crossbar circuitry can be used to interconnect a plurality of source circuits and a plurality of destination circuits such that data input to the crossbar circuitry from any of the plurality of source circuits can be output to any of the plurality of destination circuits. Crossbar circuits can be used in a variety of implementations. For example, in a data processing system implementation, such crossbar circuitry can be used to interconnect a plurality of processors used to perform data processing operations on data values with a plurality of memory devices used to store those data values, thereby allowing the data values from any memory device to be routed to any processor.

A problem with known crossbar circuits is they require a large area for the components required to form the crossbar circuitry and the significant number of control lines required for routing control signals to those components. Crossbar circuits may consume a disadvantageous amount of power. Furthermore, the complexity of crossbar circuits tends to grow rapidly with size, making many of the known techniques impractical for use with crossbar circuits required to interconnect a large number of source circuits with a large number of destination circuits. One particular problem with such crossbar circuits is how to efficiently support desired arbitration schemes.

It is known that it is desirable to provide arbitration mechanisms between data source circuits which compete to connect to a data destination circuit via interconnect circuitry. In some situations it may be acceptable to adopt a fixed priority scheme in which each data source circuit has a fixed priority value and when multiple data source circuits compete for access to a destination circuit, the data source circuit with the highest fixed priority value will be permitted the access. While it is possible to statically configure an interconnect circuit to reflect such a fixed priority, such a fixed priority arbitration scheme suffers from practical disadvantages. For example, with a fixed priority arbitration scheme, a high priority data source circuit may "starve" a lower priority data source circuit from any access to a data destination circuit. In order to deal with the limitations of fixed priority arbitration schemes, it is known to provide adaptive priority arbitration schemes in which the priority associated with each data source circuit can change with time depending upon the state of the system and the previous processing activity of the system. Examples of such adaptive priority arbitration schemes include a least recently granted scheme in which the highest priority is given to the data source circuit which has least recently been granted access to a data destination circuit. Another example is a round robin scheme in which the data source circuits take turns in being the highest priority within the arbitration scheme. Different adaptive priority arbitration schemes are desirable for use in different situations. It is desirable that interconnect circuitry should be able to support adaptive priority arbitration schemes.

A problem with supporting adaptive priority arbitration schemes in the context of crossbar circuitry is that the configuration of the crossbar circuitry to reflect the current priority levels is distributed through the crossbar circuitry such that the different portions of the crossbar circuitry may perform local arbitration control. This is desirable for improving the speed and parallelism of operation. However, when the adaptive priority changes due to processing operations performed, it is necessary to change this distributed configuration to reflect the updated priority levels. The present techniques are concerned with managing such adaptive priority schemes in an efficient and scalable manner for use within interconnect circuitry such as crossbar circuitry.

SUMMARY OF THE INVENTION

Viewed from one aspect the present invention provides interconnect circuitry for connecting a plurality of data source circuits and a plurality of data destination circuits, said interconnect circuitry comprising:

a plurality of input paths each configured to connect to a respective one of said plurality of data sources;

a plurality of output paths each configured to connect to a respective one of said plurality of data destinations and selectively to connect to one of said plurality of input paths; and an arbitration circuit associated with one of said plurality of output paths and configured to arbitrate between overlapping connection requests to said one of said plurality of output paths received from said plurality of input paths; wherein said arbitration circuit stores a matrix of priority bits having a plurality of rows of priority bits and a plurality of columns of priority bits, each intersecting pair of a given row of said plurality of rows of priority bits and a given column of said plurality of columns of priority bits representing priority information for a given input path as:

(i) which of said plurality of input paths have a lower priority than said given input path; and (ii) which of said plurality of input paths have a higher priority than said given input path; and said arbitration circuit is configured to perform a priority update upon said matrix by performing one or more update operations each acting upon one of:

(i) a selected row of said plurality of rows of priority bits; and (ii) a selected column of said plurality of columns of priority bits.

The present technique recognises that the priority relationships between different data source circuits seeking to access a data output circuit may be represented by a matrix of priority bits. This provides a representation of the priority relationships that is suitable for a high speed implementation. Furthermore, the technique recognises that by representing the priority relationships with such a matrix of priority bits, it is possible to update the priority relationships using operations which act upon one or both of selected rows of priority bits or selected columns of priority bits. This enables efficient and scalable implementations of adaptive priority arbitration mechanisms to be built into interconnect circuitry, such as crossbar circuitry.

It will be appreciated that the update operations which are performed on the rows and/or columns of the matrix of priority bits can have a variety of different forms. Some example forms of these update operations include setting all of the priority bits, resetting all of the priority bits, overriding any changes made by another update operation for a given row or column and/or swapping the bits within a given row or column with corresponding bits within another row or column (corresponding bits may have the same row or column position or may have a different position with a predetermined relationship between the bits being swapped).

The provision of the matrix of priority bits and the update operations which act upon rows and/or columns within the matrix permits the support of a wide variety of useful adaptive priority arbitration schemes. Such schemes include a least recently granted scheme, a most recently granted scheme, an incremental round robin scheme, a decremental round robin scheme, a priority swap scheme (a scheme in which two data source circuits swap their priority levels), a selective least recently granted scheme (a scheme in which at least a highest priority data source circuit maintains that highest priority level while data source circuits of a lower priority update their priority level), a selective most recently granted scheme (similar to the selective most recently granted scheme except that it is the lowest priority level data source circuits which maintain their priority level), a reversal scheme, a swap scheme and further adaptive priority schemes, e.g. schemes which may be formed from combinations of the above.

It will be appreciated that the arbitration circuit discussed above serves to provide arbitration in respect of an associated data destination circuit. An interconnect circuit containing a plurality of data destination circuits will include a plurality of such arbitration circuits with one arbitration circuit serving to support adaptive priority arbitration in respect of a corresponding data destination circuit.

The flexible and programmable nature of the priority relationship supported by the matrix of priority bits enables some embodiments of the present technique to change which priority updates to perform so as to switch between different ones of a plurality of different priority update schemes, e.g. an arbitration circuit may switch from applying least recently granted arbitration to providing round robin arbitration, or some other arbitration scheme.

This switching of the arbitration update scheme applied may be performed dynamically in dependence upon a current processing state of the system, e.g. do reflect a current processing workload.

Viewed from another aspect the invention provides interconnect circuitry for connecting a plurality of data source circuits and a plurality of data destination circuits, said interconnect circuitry comprising:

a plurality of input paths each configured to connect to a respective one of said plurality of data sources;

a plurality of output paths each configured to connect to a respective one of said plurality of data destinations and selectively to connect to one of said plurality of input paths; and arbitration means, associated with one of said plurality of output paths, for arbitrating between overlapping connection requests to said one of said plurality of output paths received from said plurality of input paths; wherein said arbitration means stores a matrix of priority bits having a plurality of rows of priority bits and a plurality of columns of priority bits, each intersecting pair of a given row of said plurality of rows of priority bits and a given column of said plurality of columns of priority bits representing priority information for a given input path as:
  (i) which of said plurality of input paths have a lower priority than said given input path; and
  (ii) which of said plurality of input paths have a higher priority than said given input path; and
said arbitration means is configured to perform a priority update upon said matrix by performing one or more update operations each acting upon one of:
  (i) a selected row of said plurality of rows of priority bits; and
  (ii) a selected column of said plurality of columns of priority bits.

Viewed from a further aspect the invention provides a method of connecting a plurality of data source circuits and a plurality of data destination circuits using interconnect circuitry, said method comprising the steps of:

connecting a plurality of input paths to a respective one of said plurality of data sources;

connecting a plurality of output paths to a respective one of said plurality of data destinations;

selectively connecting one of said plurality of output paths to one of said plurality of input paths; and arbitrating between overlapping connection requests to said one of said plurality of output paths received from said plurality of input paths; wherein said arbitrating includes:

storing a matrix of priority bits having a plurality of rows of priority bits and a plurality of columns of priority bits, each intersecting pair of a given row of said plurality of rows of priority bits and a given column of said plurality of columns of priority bits representing priority information for a given input path as:
  (i) which of said plurality of input paths have a lower priority than said given input path; and
  (ii) which of said plurality of input paths have a higher priority than said given input path; and
performing a priority update upon said matrix by performing one or more update operations each acting upon one of:
  (i) a selected row of said plurality of rows of priority bits; and
  (ii) a selected column of said plurality of columns of priority bits.

The above, and other objects, features and advantages of this invention will be apparent from the following detailed description of illustrative embodiments which is to be read in connection with the accompanying drawings.

BRIEF DESCRIPTION OF THE DRAWINGS

FIG. 9 schematically illustrates updating of the matrix in accordance with a swap scheme;

FIG. 10 schematically illustrates updating of the matrix in accordance with a reversal scheme;

FIG. 11 schematically illustrates updating of the matrix in accordance with a selective least recently granted scheme;

DESCRIPTION OF THE EMBODIMENTS

Figure 1:
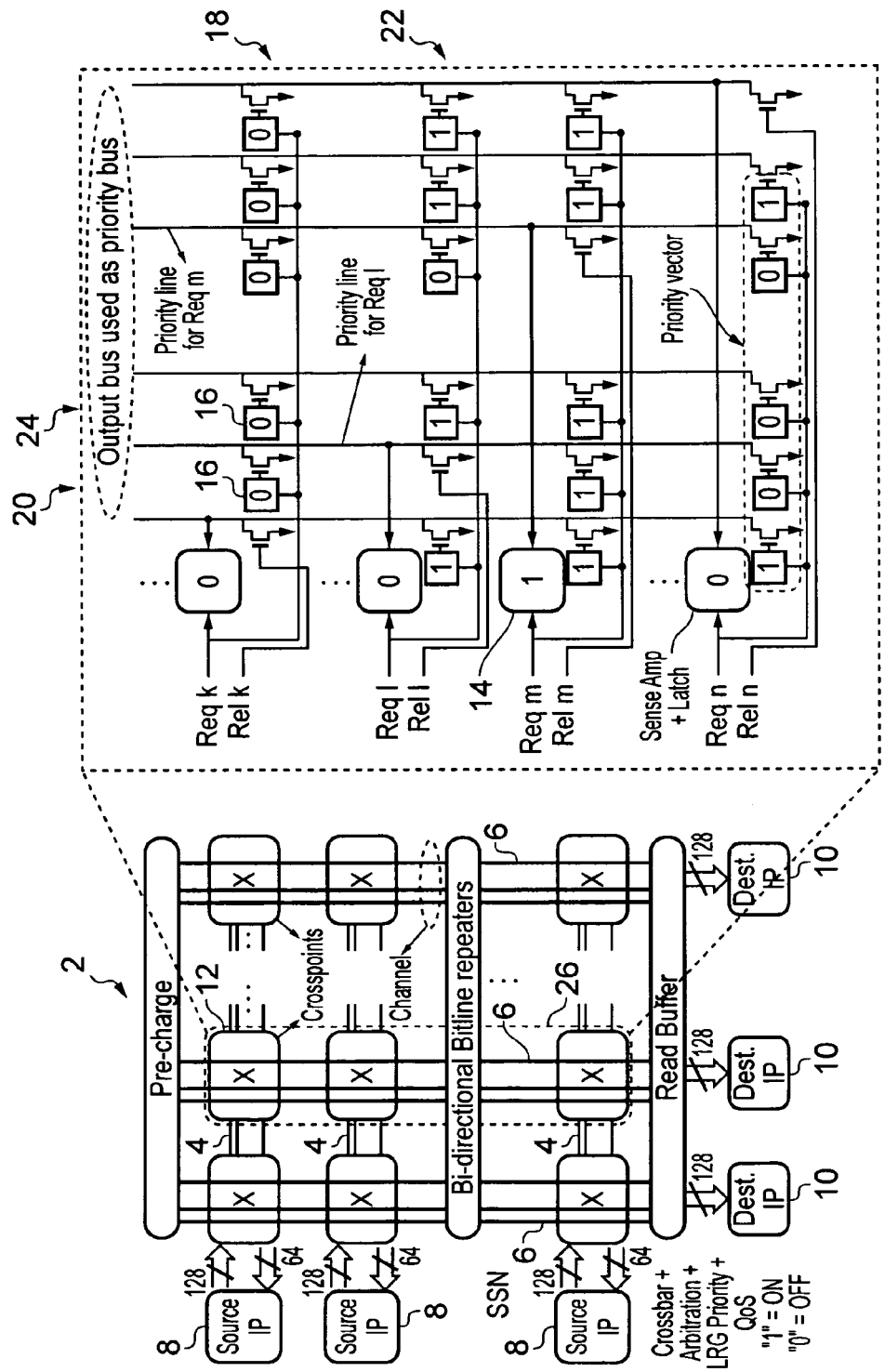
FIG. 1 schematically illustrates a crossbar circuit (matrix-type fabric) serving as interconnect circuitry between a plurality of data source circuits and a plurality of data destination circuits.

FIG. 1 schematically illustrates an interconnect circuit 2 (matrix-type fabric or crossbar circuit) with a plurality of input paths 4 running horizontally and a plurality of output paths 6 running vertically. A plurality of data source circuits 8 are connected to respective input paths 4 and a plurality of data destination circuits 10 are connected to respective output paths 6. At the intersection of each input path 4 and each output path 6 are disposed connection cells 12 which selectively provide a connection between an input path 4 and an output path 6 thereby permitting data communication between a corresponding data source circuit 8 and a data destination circuit 10. When data is routed, the input and output paths transfer data traffic.

In order to provide arbitration between data source circuits 8 which may generate overlapping connection requests which would otherwise contend, the input path routes a multi-hot code indicating which output channel(s) is requested by that input, and the output path is used for conflict detection and arbitration. A description of this mechanism may be found the co-pending U.S. patent application Ser. No. 12/926,462 of which the present application is a continuation-in-part application.

Each cross point 12 stores a connectivity status bit 14 indicating whether the input path was granted access to the output path. A priority encoding in the form of a matrix of priority bits 16 is used to represent the priority ordering of the input paths for any particular output path. As an example, in a system having 64 input paths, a 63-bit priority vector is stored for each input path to represent the priority of that input path with respect to all other input paths for that output path. These 63 bits are arranged horizontally in a row as illustrated in FIG. 1. The input bits within a row represent which of the plurality of other input paths have a lower priority than the input path of that row. The row does not need to store a priority bit representing its priority relative to itself resulting in the need to store only 63 bits for each row in this example embodiment.

In the example embodiment shown in the Figures, when considered as rows, a priority bit "1" stored at a given column position within a row of the matrix indicates that the input path for that row has a higher priority than the input path corresponding to the given column position within that row, i.e. the priority of bits within a row indicate which of the plurality of input paths other than the input path for that row have a lower priority than the input path of that row.

When the matrix of input bits are considered as columns, a priority bit of "1" within a column corresponding to the priority line of a given input path indicates which of the other of the plurality of input paths have a higher priority than the input path of that column. It will be appreciated that a given priority bit represents which of a plurality of input paths have a lower priority than a given input path when considered as part of a row for that input path and also indicates which of a plurality of input paths have a higher priority than a given input path when considered as part of the column corresponding to that input path.

In the example shown in FIG. 1 input path k corresponds to the row 18 through the matrix and the column 20 through the matrix. Similarly, input path L corresponds to row 22 and column 24.

The right hand portion of FIG. 1 illustrates the priority bit values at each cross point in the arbitration circuit 26 controlling the particular output path as illustrated surrounded by the dashed line in FIG. 1. It will be appreciated that a similar arbitration circuit, each with its own matrix of priority bits, is provided in respect of each of the output paths. The distribution of the priority bits across the interconnect in this way demonstrates the devolved nature of the arbitration control and also the need for an efficient and scalable technique for updating that priority information if adaptive priority arbitration is to be supported.

Each input path is assigned its own bit line (priority line) within the channel of an output path being managed by an arbitration circuit 26 which, if high, indicates that it is the winner of a particular arbitration cycle. Similarly, each bit in the matrix of priority bits at a cross point corresponds with a priority line (bit-line) and indicates whether the input bus at that cross point has a higher or lower priority than the input bus associated with that priority line.

Figure 2:
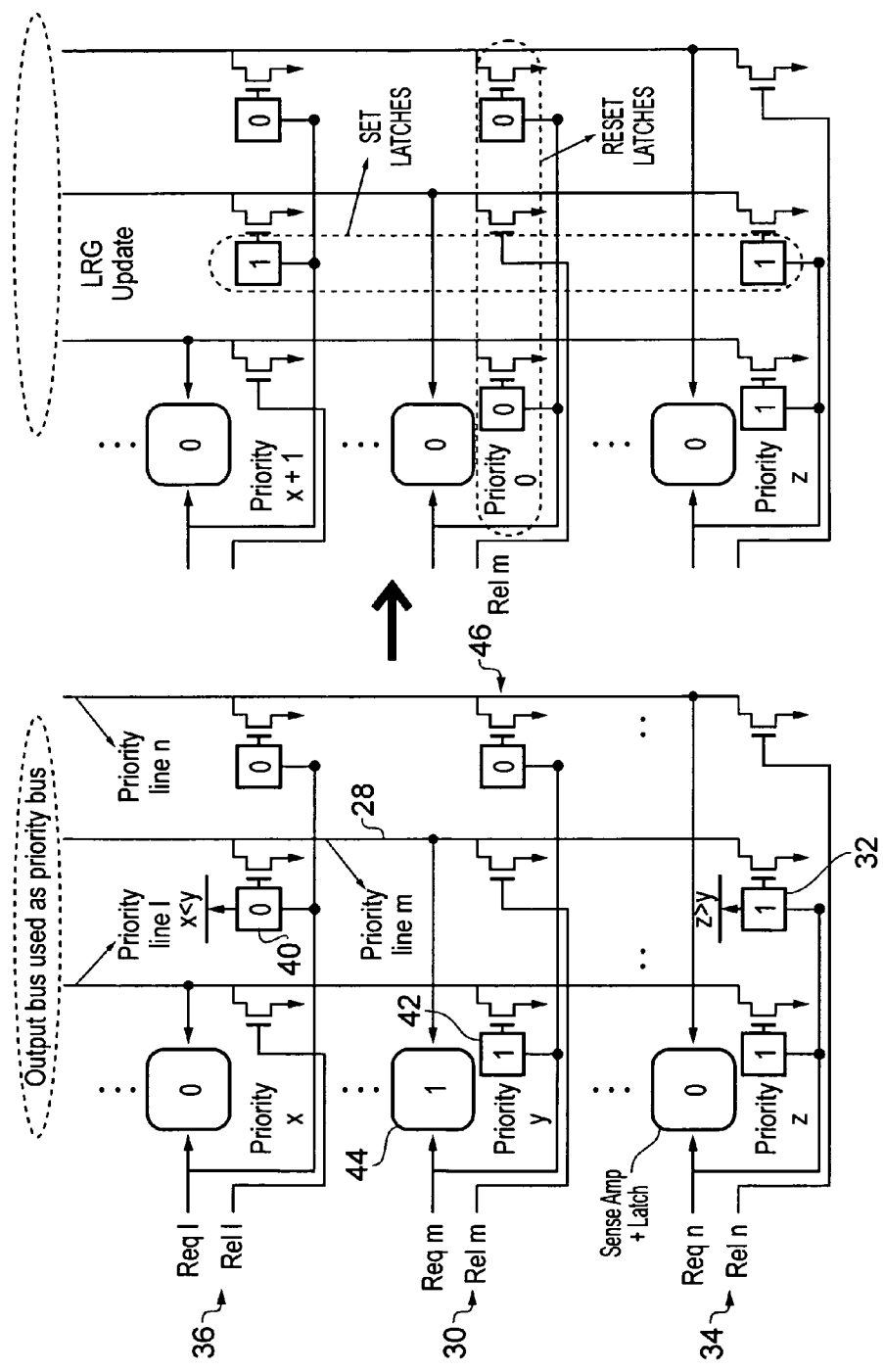
FIG. 2 schematically illustrates priority based arbitration control in respect of one data output path within a portion of the interconnect circuit of FIG. 1.

In the example of FIG. 2, priority line m 28 corresponds to the input path m 30. The m-th priority bit 32 of input path n 34 is set as "1" indicating that input path n 34 has a higher priority than input path m 30. When input path n 34 requests the output channel, this priority bit 32 being high results in a discharge of the priority line 28 for input path m 30. This suppresses access to the output path by the input path m 30 during that cycle.

In contrast, input path 1 36 stores a priority bit "0" 40 at its m-th priority bit position and hence does not suppress an access request from input path m 30 (corresponding to input path 1 36 having a lower priority than input path m 30).

It will be appreciated that the rows of priority values set for each input path must be consistent with each other in order to indicate the same relative priority ordering. In the example of FIG. 2, the "0" priority bit 40 at bit m of input path 1 is mirrored with a value "1" at priority bit 42 of bit 1 of input path m 30.

As well as being self-consistent in their static state, the priority bits when updated to reflect an adaptive priority arbitration scheme after each arbitration cycle should remain self-consistent in their updated form. In order to implement a least recently granted adaptive priority arbitration update scheme in the example of FIG. 2, one mechanism that can achieve this can is described below.

In FIG. 2 input paths 36 and 30 request the output channel in the same arbitration cycle. Input path 30 wins due to its higher priority and its connectivity status 44 is set to "1". After the data transfer, input path 30 releases its channel during a channel release cycle. In this channel release cycle, input path 30 first resets all of its own priority bits stored within the row 56. This reflects that in the next arbitration cycle the input path 30 will have a lower priority than all of the other input paths as required by a least recently granted arbitration scheme.

At the same time as the resetting of the priority bits within the row 36, the input path 30 also lowers the priority line 28 to which it corresponds. This lowering of the priority line 28 signals to the other crosspoints for the output path concerned to set their m-th priority bit to a value of "1". This indicates that all of the other input paths now have a higher priority than the input path 30. Input paths that already have a higher priority than input path 30 will remain unchanged and input paths which previously had a lower priority path than input path 30 will be increased in their priority by one level. This update mechanism provides both internal consistency between the matrix of priority bit values and implements a least recently granted arbitration update mechanism so as to enable efficient and deadlock-free routing.

Figure 3:
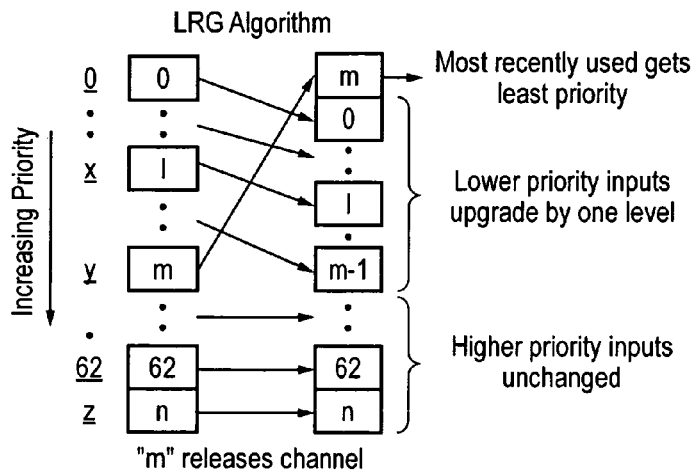
FIG. 3 schematically illustrates operation of a least recently granted algorithm for adaptively controlling priority levels.

FIG. 3 illustrates the priority levels associated with the above described example of the operation of a least recently granted adaptive priority arbitration scheme. In particular, the priority level of the m-th input channel 30 is changed to be the lowest level, all priority levels previously below the input path 30 are promoted by one priority level and all of the priority levels previously above the input path 30 remain unchanged.

Figure 4:
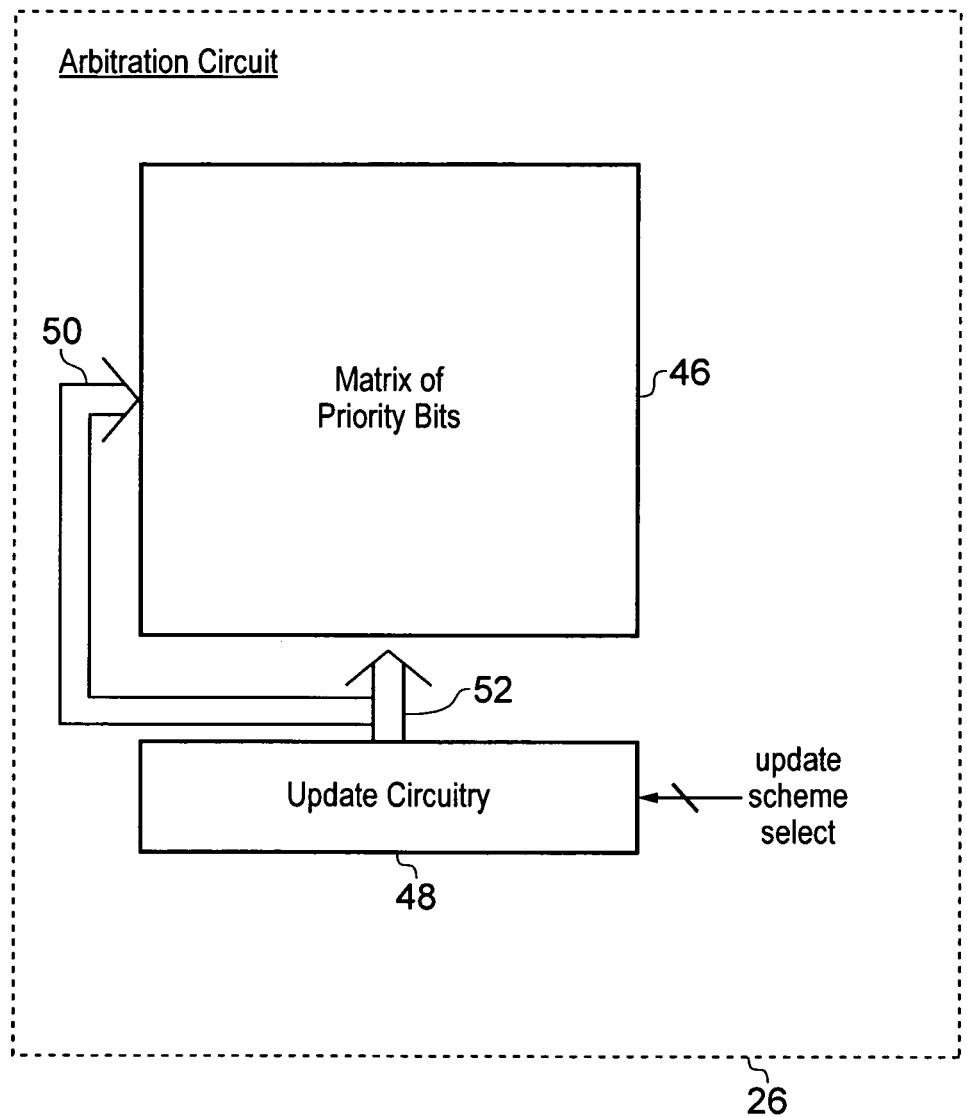
FIG. 4 schematically illustrates arbitration circuitry storing a matrix of priority bits and subject to update operations operating upon selected rows and/or columns within the matrix.

FIG. 4 schematically illustrates the arbitration circuitry 26 as including a matrix of priority bits 46 and update circuitry 48. The update circuitry 48 provides update operations which apply to selected rows of priority bits via path 50 or to selected columns of priority bits via path 52. An input to the update circuitry 48 may select which update scheme is currently in use. The update scheme in use may be dynamically selected, e.g. in dependence upon the current processing workload of the system of some other state parameter. Depending upon the particular form of adaptive priority arbitration updating required, the update operations may vary. Examples of the update operations supported include:
(i) setting all of the priority bits within a selected row or column to a first value (e.g. "1");
(ii) resetting all the priority bits within a given row or column to a second value (e.g. "0");
(iii) overriding for all priority bits within a given row or column any changes made by another update operation being performed during the same update cycle; and
(iv) swapping priority bits within a selected row or column with corresponding priority bits within another row or column (corresponding may represent having the same row or column position within the swapped columns or rows or having relative positions with a predetermined relationship between the columns or rows).

In practice, the matrix of priority bits 46 may be distributed throughout the arbitration circuitry 26 as illustrated in FIGS. 1 and 2. Furthermore, the update circuitry 48 may be distributed through the arbitration circuitry 26 and the update operations may take the form the release of the priority lines and the response of the circuit elements thereto as described above.

Figure 5:
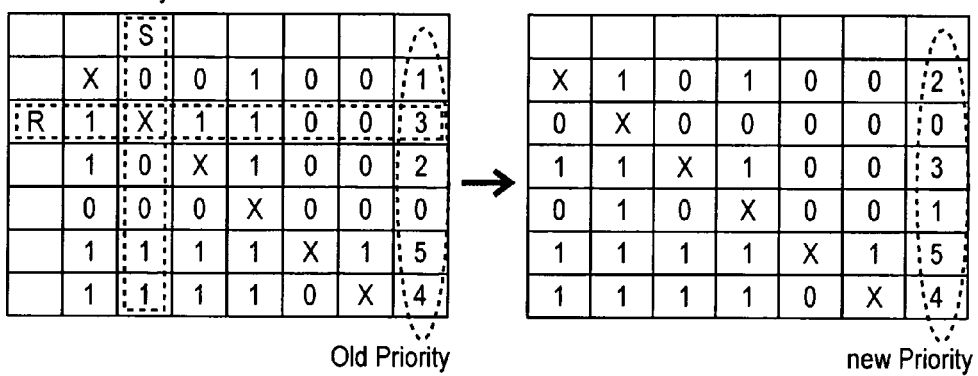
FIG. 5 schematically illustrates update of the matrix in accordance with a least recently granted scheme.

As previously discussed, the priority bit values within the priority matrix obey certain rules. FIG. 5 illustrates a priority matrix with six inputs and six outputs. Each row within the matrix corresponds to the "priority vector" for a given input path. The priority line connected to by a given input path is denoted as X within the matrix and also corresponds to a point within a priority vector where the priority vector does not need to represent its relative priority relationship with respect to another input path. It will be appreciated that FIG. 5 shows the priority vectors arranged in rows, but it is equally possible that the priority vectors be arranged in columns. The priority matrix satisfies the following criteria:

(i) the total number "0"s equals the total number of "1"s;
(ii) each row has a unique number of "1"s which represents its corresponding priority level;
(iii) each column has a unique number of "1"s; and
(iv) at any priority line connection (denoted as an "X"), the sum of the number of "1"s (or "0"s) in its corresponding row and column adds up to one less than the total number of input paths supported.

Although priority lines may be randomly assigned to the input paths without limiting the generality of the priority update schemes described herein, the diagonal assignment as illustrated in FIG. 5 makes the priority matrix skew (or anti) symmetric and easier to understand.

As illustrated in FIG. 5, the input path corresponding to the second row was granted access to the output path most recently. The priority associated with the input path corresponding to the second row is 3. A least recently granted priority update is performed by resetting all the priority bits along the second row (denoted by R) and setting all the priority bits (denoted by S) along the second column (which is the priority line for the second input path).

In the following description of other adaptive priority arbitration update schemes, the same matrix notation and the matrix arrangement will be used as discussed above.

Figure 6:
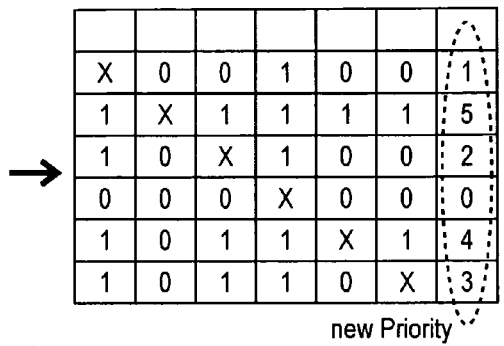
FIG. 6 schematically illustrates updating of the matrix in accordance with a most recently granted scheme.

FIG. 6 illustrates the update operations performed to achieve a most recently granted update scheme. In this example, the second input path corresponding to the second row in the matrix has just completed its access to the output path. In this update scheme all the priority bits along the second row are set (denoted by S) and all the priority bits along the corresponding column are reset. It will be appreciated that in such setting and resetting operations some of the priority bits within the row or column concerned may already have the final value which is achieved by the set or reset operation and accordingly will not change their value. Such a situation is encompassed within the use of the term setting and resetting herein.

In the update operations illustrated in FIG. 6, by setting all the bits of the second row, input path 2 now gets the highest priority. Input paths which previously had a higher priority than input path 2 get downgraded by one level. Input paths which previously had a lower priority than input path 2 retain their priority.

Figure 7:
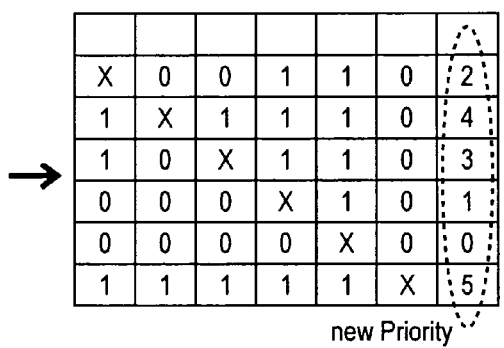
FIG. 7 schematically illustrates updating of the matrix in accordance with an incrementing round robin scheme.

FIG. 7 schematically illustrates update operations for achieving an incremental round robin based update scheme. In this update scheme the input path with the highest priority is selected for update operations. Such an input path may be identified by a combination of gates such as a logical AND of all the priority bits within a row of the priority bit matrix. In the example of FIG. 7, it is the fifth row which has the highest priority prior to the update operation. All of the bits within this fifth row are reset (denoted by R). All of the priority bits within the fifth column (which is the priority line for the fifth input) are set (denoted by S). By resetting all of the bits within the fifth row, input 5 becomes the input with the least priority. All of the other inputs are upgraded by one priority level.

Figure 8:
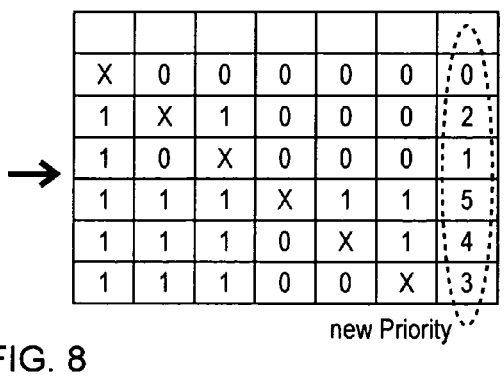
FIG. 8 schematically illustrates updating of the matrix in accordance with a decrementing round robin scheme.

FIG. 8 schematically illustrates the update operations performed to accomplish a decrementing round robin update. The input path having the lowest priority prior to the update is selected. This can be identified by, for example, a logical OR of all the priority bits within that input path row. In this example, input 4 has the lowest priority. All of the priority bits along the fourth row are set (denoted by S) and all of the priority bits along the fourth column (which is the priority line for input path 4) are reset (denoted by R). By setting all of the bits in the fourth row, input path 4 now gets the highest priority. All of the other input paths are downgraded by one priority level.

FIG. 9 schematically illustrates the update operations which may be performed to swap priority levels between input paths. This swapping is performed without affecting the priority levels of other input paths. As illustrated in FIG. 9 the priority bits in the corresponding rows and columns for the two input path concerned are swapped. In the example, it is the priority bits corresponding to input path 3 and input path 4 which are swapped. In one example physical implementation of this technique, existing word lines may be used to swap existing priority bits within columns and existing bit lines may be used to swap priority bits between rows. In a single cycle, any two priorities can be swapped. The priority bit values are swapped between columns and rows at positions outside of the intersection of those columns and rows so as to maintain their row and column positions respectively. Within the intersection region, the priority bit values are swapped in both row and column positions resulting in a diagonal swap (exchange of bit values).

FIG. 10 schematically illustrates the update operations performed to achieve a reversal of the existing priority levels. The update operations are performed in respect of each row within the priority matrix and serve to reverse the bit value stored at each position within the matrix. In a physical implementation of this technique, rather than changing the values of all the bits stored within the matrix, the same logical effect may be had by instead interpreting all the stored priority bits with an inverted priority. This consumes less power and speed. The inversion of all of the priority bit values maintains consistency of the new priority vectors which will all still satisfy the criteria previously discussed.

FIG. 11 schematically illustrates a selective least recently granted update scheme. In the normal least recently granted update scheme as indicated in FIG. 5, the input that used the output bus most recently is downgraded to have the least priority value while all inputs with priority values lower get upgraded by one level. In this example selective least recently granted upgrade scheme, the input path 6 with a priority value of 4 used the channel most recently, but instead of downgrading this to the lowest level of priority, it is instead downgraded to some intermediate level of priority (in this example the priority of input path 0, which is priority level 2). In order to accomplish this, before setting and resetting priority bits, a number of rows and columns that need to be frozen (overriding any update otherwise to be applied) are identified. In this case, all of the columns corresponding to the priority bits that are high in the first row are frozen. Simultaneously, all rows corresponding to priority bits that are low in the first column (which is the priority line for input path 0) are also frozen. Following setting up of these override operations, the priority bits in the sixth row are reset (except for the bits in the frozen columns) and those in the sixth column are set (except for the frozen rows). This provides that the new priority matrix is consistent and the intended update is achieved.

Figures 12, 13:
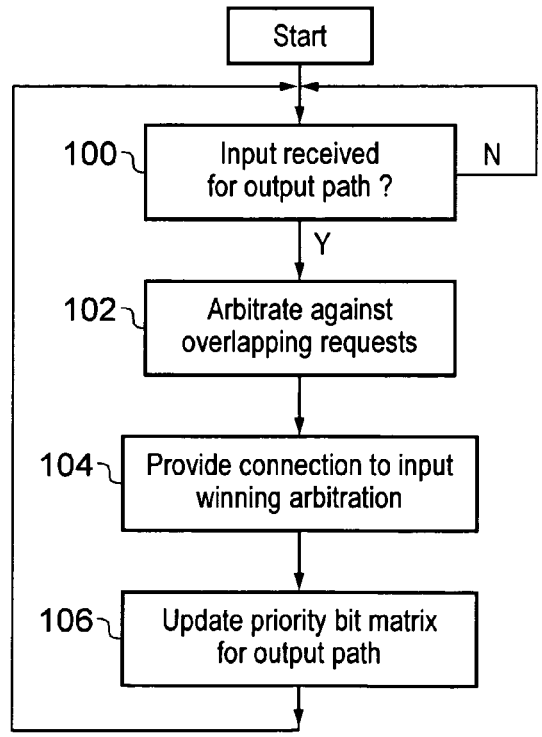
FIG. 12 schematically illustrates updating of the matrix in accordance with a selective most recently granted scheme.
FIG. 13 is a flow diagram schematically illustrating a method for performing adaptive priority arbitration.

FIG. 12 schematically illustrates a selective most recently granted update. In this scheme the most recently granted update is applied to a selective section of the input paths. In the standard most recently granted update scheme illustrated in FIG. 6, the input that used the output bus most recently is upgraded to have the highest priority while all other input paths with lower priorities get downgraded by one level. In this example selective most recently granted update scheme, the input path 1 with a priority 1 used the channel most recently. However, instead of upgrading input path 1 all the way to priority level 5, it is instead upgraded to some intermediate priority level (say the priority level of input path level 6, which is 4). To accomplish this, before setting/resetting priority bits certain rows and columns that need to be frozen are identified. In this case, all columns corresponding to priority bits that are low in the sixth row are frozen. Simultaneously, all rows corresponding to priority bits that are high in the sixth column (which is the priority line for input path 6) are also frozen. Following the setting up of these override operations, the priority bits in the first row are set (except the bits in the frozen columns) and the priority bits in the first column are reset (except for the bits in the frozen rows). This ensures that the next priority matrix is consistent and the intended update is achieved.

FIG. 13 is a flow diagram schematically illustrating arbitration in accordance with an adaptive priority arbitration scheme. At step 100 processing waits until an input request from an input path is received in respect of a given output path. At step 102 this input request is arbitrated against any other overlapping input request. At step 104 a connection is provided to the winning input path. At step 106 update operations as described above are applied to the priority bits within the matrix for the output path concerned in respect of the winning input path which was provided with the connection at step 104. Processing then returns to step 100.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Interconnect circuitry for connecting a plurality of data source circuits and a plurality of data destination circuits, said interconnect circuitry comprising:
    a plurality of input paths each configured to connect to a respective one of said plurality of data sources;
    a plurality of output paths each configured to connect to a respective one of said plurality of data destinations and selectively to connect to one of said plurality of input paths; and
    an arbitration circuit associated with one of said plurality of output paths and configured to arbitrate between overlapping connection requests to said one of said plurality of output paths received from said plurality of input paths; wherein
    said arbitration circuit stores a matrix of priority bits having a plurality of rows of priority bits and a plurality of columns of priority bits, each intersecting pair of a given row of said plurality of rows of priority bits and a given column of said plurality of columns of priority bits representing priority information for a given input path as:
        (i) which of said plurality of input paths have a lower priority than said given input path; and
        (ii) which of said plurality of input paths have a higher priority than said given input path; and
    said arbitration circuit is configured to perform a priority update upon said matrix by performing one or more update operations each acting upon one of:
        (i) a selected row of said plurality of rows of priority bits; and
        (ii) a selected column of said plurality of columns of priority bits.

2. Interconnect circuitry as claimed in claim 1, wherein said one or more update operations include one or more of:
    setting all priority bits within said selected row to a first value;

setting all priority bits within said selected column to a first value;

setting all priority bits within said selected row to a second value;

setting all priority bits within said selected column second value;

overriding, for all priority bits within said selected row, any changes made by another update operation;

overriding, for all priority bits within said selected column, any changes made by another update operation;

swapping priority bits within said selected row with corresponding priority bits within another row of said plurality of rows of priority bits; and swapping priority bits within said selected column with corresponding priority bits within another column of said plurality of columns of priority bits.

3. Interconnect circuitry as claimed in claim 1, wherein said priority update performs arbitration in accordance with a least recently granted scheme when said given input path has most recently been granted access to said one of said plurality of output paths by performing update operations upon said given row and said given column such that said that:

all priority bits which indicate which of said plurality of input paths have a lower priority than said given input path are set to indicate that none of said input paths have a lower priority than said given input path; and all priority bits which indicate which of said plurality of input paths have a higher priority than said given input path are set to indicate that all of said input paths have a higher priority than said given input path.

4. Interconnect circuitry as claimed in claim 1, wherein said priority update performs arbitration in accordance with a most recently granted scheme when said given input path has most recently been granted access to said one of said plurality of output paths by performing update operations upon said given row and said given column such that said that:

all priority bits which indicate which of said plurality of input paths have a lower priority than said given input path are set to indicate that all of said input paths have a lower priority than said given input path; and all priority bits which indicate which of said plurality of input paths have a higher priority than said given input path are set to indicate that none of said input paths have a higher priority than said given input path.

5. Interconnect circuitry as claimed in claim 1, wherein said priority update performs arbitration in accordance with an incremental round robin scheme when said given input path has a current highest priority for access to said one of said plurality of output paths by performing update operations upon said given row and said given column such that said that:

all priority bits which indicate which of said plurality of input paths have a lower priority than said given input path are set to indicate that none of said input paths have a lower priority than said given input path; and all priority bits which indicate which of said plurality of input paths have a higher priority than said given input path are set to indicate that all of said input paths have a higher priority than said given input path.

6. Interconnect circuitry as claimed in claim 1, wherein said priority update performs arbitration in accordance with an decremental round robin scheme when said given input path has a current lowest priority for access to said one of said plurality of output paths by performing update operations upon said given row and said given column such that said that:

all priority bits which indicate which of said plurality of input paths have a lower priority than said given input path are set to indicate that all of said input paths have a lower priority than said given input path; and all priority bits which indicate which of said plurality of input paths have a higher priority than said given input path are set to indicate that none of said input paths have a higher priority than said given input path.

7. Interconnect circuitry as claimed in claim 1, wherein said priority update performs arbitration in accordance with a priority swap scheme when said given input path and another input path associated with another row of said plurality of rows of priority bits and another column of said plurality of columns of priority bits are to swap priorities by performing update operations upon said given row and said given column such that said that:

all priority bits within said given row swap with corresponding priority bits within said another row; and all priority bits within said given column swap with corresponding priority bits within said another column.

8. Interconnect circuitry as claimed in claim 1, wherein said priority update performs arbitration in accordance with a reversing scheme by performing update operations that invert values of all said priority bits within said matrix of priority bits.

9. Interconnect circuitry as claimed in claim 1, wherein said priority update performs arbitration in accordance with a selective least recently granted scheme when said given input path has most recently been granted access to said one of said plurality of output paths and a lowest priority input path has a lowest priority for gaining access to said one of said plurality of output paths by performing update operations upon said given row and said given column such that said that:

all priority bits which indicate which of said plurality of input paths have a lower priority than said given input path are set to indicate that none of said input paths have a lower priority than said given input path;

all priority bits which indicate which of said plurality of input paths have a higher priority than said given input path are set to indicate that all of said input paths have a higher priority than said given input path; and overriding all changes to priority bits for said lowest priority input path which indicate which of said plurality of input paths have a higher priority than said lowest priority input path.

10. Interconnect circuitry as claimed in claim 1, wherein said priority update performs arbitration in accordance with a selective most recently granted scheme when said given input path has most recently been granted access to said one of said plurality of output paths and a highest priority input path has a highest priority for gaining access to said one of said plurality of output paths by performing update operations upon said given row and said given column such that said that:

all priority bits which indicate which of said plurality of input paths have a lower priority than said given input path are set to indicate that all of said input paths have a lower priority than said given input path;

all priority bits which indicate which of said plurality of input paths have a higher priority than said given input path are set to indicate that none of said input paths have a higher priority than said given input path; and overriding all changes to priority bits for said highest priority input path which indicate which of said plurality of input paths have a higher priority than said lowest priority input path.

11. Interconnect circuitry as claimed in claim 1, comprising a plurality of said arbitration circuits, each arbitration circuitry associated with a respective one of said plurality of output paths.

12. Interconnect circuitry as claimed in claim 1, wherein said arbitration circuit is configured to select which priority update to perform from among a plurality of different priority update schemes.

13. Interconnect circuitry as claimed in claim 3, wherein:
(i) said given row indicates which of said plurality of input paths have a higher priority than said given input path; and
(ii) said given column indicates which of said plurality of input paths have a lower priority than said given input path; and
said update operations performed upon said given row and said given column are:
resetting all bits within said given row to indicate that none of said plurality of input paths have a lower priority than said given input path; and
setting all bits within said given column to indicate that all of said plurality of input paths have a higher priority than said given input path.

14. Interconnect circuitry as claimed in claim 4, wherein:
(i) said given row indicates which of said plurality of input paths have a higher priority than said given input path; and
(ii) said given column indicates which of said plurality of input paths have a lower priority than said given input path; and
said update operations performed upon said given row and said given column are:
setting all bits within said given row to indicate that all of said plurality of input paths have a lower priority than said given input path; and
resetting all bits within said given column to indicate that none of said plurality of input paths have a higher priority than said given input path.

15. Interconnect circuitry as claimed in claim 5, wherein:
(i) said given row indicates which of said plurality of input paths have a higher priority than said given input path; and
(ii) said given column indicates which of said plurality of input paths have a lower priority than said given input path; and
said update operations performed upon said given row and said given column are:
resetting all bits within said given row to indicate that none of said plurality of input paths have a lower priority than said given input path; and
setting all bits within said given column to indicate that all of said plurality of input paths have a higher priority than said given input path.

16. Interconnect circuitry as claimed in claim 6, wherein:
(i) said given row indicates which of said plurality of input paths have a higher priority than said given input path; and
(ii) said given column indicates which of said plurality of input paths have a lower priority than said given input path; and
said update operations performed upon said given row and said given column are:
setting all bits within said given row to indicate that all of said plurality of input paths have a lower priority than said given input path; and
resetting all bits within said given column to indicate that none of said plurality of input paths have a higher priority than said given input path.

17. Interconnect circuitry as claimed in claim 7, wherein:
priority bits outside of intersections of said given row and said another row with said given column and said another column are swapped between rows maintaining column position and are swapped between columns maintaining row position; and
priority bits inside of intersections of said given row and said another row with said given column and said another column are swapped between rows and swapped between columns.

18. Interconnect circuitry as claimed in claim 9, wherein:
(i) said given row indicates which of said plurality of input paths have a higher priority than said given input path;
(ii) said given column indicates which of said plurality of input paths have a lower priority than said given input path; and
(iii) a lowest priority column indicates none of said plurality of input paths have a lower priority that said lowest priority input path; and
said update operations performed upon said given row and said given column are:
resetting all bits within said given row to indicate that none of said plurality of input paths have a lower priority than said given input path;
setting all bits within said given column to indicate that all of said plurality of input paths have a higher priority than said given input path; and
overriding all changes to priority bits within said lowest priority column.

19. Interconnect circuitry as claimed in claim 10, wherein:
(i) said given row indicates which of said plurality of input paths have a higher priority than said given input path;
(ii) said given column indicates which of said plurality of input paths have a lower priority than said given input path; and
(iii) a highest priority column indicates none of said plurality of input paths have a lower priority that said lowest priority input path; and
said update operations performed upon said given row and said given column are:
setting all bits within said given row to indicate that all of said plurality of input paths have a lower priority than said given input path;
resetting all bits within said given column to indicate that none of said plurality of input paths have a higher priority than said given input path; and
overriding all changes to priority bits within said highest priority column.

20. Interconnect circuitry as claimed in claim 12, wherein said arbitration circuit dynamically selects which priority update to perform in dependence upon a current processing state of said plurality of data source circuits and said plurality of data destination circuits.

21. Interconnect circuitry for connecting a plurality of data source circuits and a plurality of data destination circuits, said interconnect circuitry comprising:
a plurality of input paths each configured to connect to a respective one of said plurality of data sources;
a plurality of output paths each configured to connect to a respective one of said plurality of data destinations and selectively to connect to one of said plurality of input paths; and
arbitration means, associated with one of said plurality of output paths, for arbitrating between overlapping connection requests to said one of said plurality of output paths received from said plurality of input paths; wherein
said arbitration means stores a matrix of priority bits having a plurality of rows of priority bits and a plurality of columns of priority bits, each intersecting pair of a given row of said plurality of rows of priority bits and a given column of said plurality of columns of priority bits representing priority information for a given input path as:
(i) which of said plurality of input paths have a lower priority than said given input path; and
(ii) which of said plurality of input paths have a higher priority than said given input path; and said arbitration means is configured to perform a priority update upon said matrix by performing one or more update operations each acting upon one of:
(i) a selected row of said plurality of rows of priority bits; and
(ii) a selected column of said plurality of columns of priority bits.

22. A method of connecting a plurality of data source circuits and a plurality of data destination circuits using interconnect circuitry, said method comprising the steps of:
connecting a plurality of input paths to a respective one of said plurality of data sources;
connecting a plurality of output paths to a respective one of said plurality of data destinations;
selectively connecting one of said plurality of output paths to one of said plurality of input paths; and
arbitrating between overlapping connection requests to said one of said plurality of output paths received from said plurality of input paths; wherein said arbitrating includes:
storing a matrix of priority bits having a plurality of rows of priority bits and a plurality of columns of priority bits, each intersecting pair of a given row of said plurality of rows of priority bits and a given column of said plurality of columns of priority bits representing priority information for a given input path as:
(i) which of said plurality of input paths have a lower priority than said given input path; and
(ii) which of said plurality of input paths have a higher priority than said given input path; and
performing a priority update upon said matrix by performing one or more update operations each acting upon one of:
(i) a selected row of said plurality of rows of priority bits; and
(ii) a selected column of said plurality of columns of priority bits.

* * * * *